US012784827B2

(12) United States Patent
Kim et al.

(10) Patent No.: US 12,784,827 B2
(45) Date of Patent: Nov. 3, 2026

(54) DEVICE-BASED CROSS POINT ARRAY AND METHOD OF OPERATION THEREOF

(71) Applicant: POSTECH RESEARCH AND BUSINESS DEVELOPMENT FOUNDATION, Pohang-si (KR)

(72) Inventors: Seyoung Kim, Pohang-si (KR); Byoungwoo Lee, Pohang-si (KR)

(73) Assignee: POSTECH RESEARCH AND BUSINESS DEVELOPMENT FOUNDATION, Pohang-si (KR)

( * ) Notice: Subject to any disclaimer, the term of this patent is extended or adjusted under 35 U.S.C. 154(b) by 124 days.

(21) Appl. No.: 18/758,245

(22) Filed: Jun. 28, 2024

(65) Prior Publication Data

US 2025/0140313 A1 May 1, 2025

(30) Foreign Application Priority Data

Oct. 27, 2023 (KR) ........................ 10-2023-0145820

(51) Int. Cl.
*G11C 13/00* (2006.01)

(52) U.S. Cl.
CPC .................................. *G11C 13/004* (2013.01)

(58) Field of Classification Search
CPC ....... G11C 13/004; G11C 11/405; G11C 5/10; G11C 7/16; G06G 7/16
See application file for complete search history.

(56) References Cited

U.S. PATENT DOCUMENTS

| | | | | |
|---|---|---|---|---|
| 8,699,255 B2 * | 4/2014 | Yu | G11C 11/4097 | 365/230.03 |
| 9,152,827 B2 * | 10/2015 | Linderman | G06N 3/044 | |
| 9,312,002 B2 * | 4/2016 | Navon | G11C 13/0069 | |
| 9,947,399 B2 * | 4/2018 | Navon | G06F 11/1048 | |
| 9,947,401 B1 * | 4/2018 | Navon | G06F 11/3034 | |
| 11,526,285 B2 * | 12/2022 | Wang | G06N 3/0464 | |
| 2011/0302354 A1 * | 12/2011 | Miller | G11C 16/22 | 711/E12.001 |
| 2013/0135925 A1 * | 5/2013 | Scheuerlein | G11C 13/0069 | 365/163 |
| 2020/0161373 A1 * | 5/2020 | Cheng | H10B 63/20 | |
| 2023/0065091 A1 * | 3/2023 | Reznicek | G06N 3/065 | |

FOREIGN PATENT DOCUMENTS

KR 10-2021-0072391 A 6/2021

* cited by examiner

*Primary Examiner* — Han Yang
(74) *Attorney, Agent, or Firm* — Hauptman Ham, LLP

(57) ABSTRACT

Disclosed a device-based cross point array and a method of operation therefor. The method relates to a method for updating a cross point array implemented as a device where a potentiation region and a depression region are separated, and the method is performed by a control logic. The method includes: in a first cycle, controlling lines where positive values are applied among first lines, in ON state, and applying a first voltage pulse at each of second lines intersecting with the first lines based on an applied value; and in a second cycle, controlling lines where negative values are applied among the first lines, in ON state, and applying a second voltage pulse at each of the second lines based on an applied value.

20 Claims, 13 Drawing Sheets

| $Row_{up}$ \ $Col_{up}$ | $V_{DD}$ | $V_{DD}-V_{th}$ |
|---|---|---|
| $V_{DD}-V_{th}$ | OFF | OFF |
| $V_{DD}$ | OFF | Potentiation |

| $Row_{dn}$ \ $Col_{dn}$ | $V_{SS}$ | $V_{SS}+V_{th}$ |
|---|---|---|
| $V_{SS}+V_{th}$ | OFF | OFF |
| $V_{SS}$ | OFF | Depression |

Stochastic Update Scheme

Selector: $V_{DD}$

| Row \ Col | OFF | ON |
|---|---|---|
| OFF | OFF | OFF |
| ON | OFF | Potentiation |

Selector: GND

| Row \ Col | OFF | ON |
|---|---|---|
| OFF | OFF | OFF |
| ON | OFF | Depression |

| $V_{G2}$ \ $V_{G1}$ | $V_{DD}$ | $V_{DD}+V_{th}$ |
|---|---|---|
| $V_{DD}$ | OFF | OFF |
| $V_{DD}+V_{th}$ | OFF | Potentiation /Depression |

DEVICE-BASED CROSS POINT ARRAY AND METHOD OF OPERATION THEREOF

CROSS-REFERENCE TO RELATED APPLICATION(S)

The present application claims the benefit of priority to Korean Patent Application No. 10-2023-0145820 filed on Oct. 27, 2023, in the Korean Intellectual Property Office. The aforementioned application is hereby incorporated by reference in its entirety.

BACKGROUND

Field

The present disclosure relates to a technology of updating a cross point array for a specific device, and more specifically, a method for efficiently updating a cross point array in two cycles when a resistive processing unit where potentiation and depression are separated is implemented in the form of an array.

Related Art

Matrix operations using analog arrays are the key computations for µl learning and inference processes, and may improve computational performance by over several hundred times compared to conventional digital hardware.

Among methods for updating analog arrays in parallel, a stochastic update scheme involves applying random pulses corresponding to values in rows and columns to perform matrix multiplication.

If all the values corresponding to the rows and columns are positive, the array may be updated in a single pulse cycle, whereas if a mixture of positive and negative values exists in the rows and columns, up to four pulse cycles may be required for updating.

Hence, rows (or columns) having positive values and rows (or columns) having negative values are grouped, for example, as (Row, Column)=(+,+), (+,−), (−,+), (−,−), so that all devices in the array can be updated in parallel without interfering with each other. That is, due to the necessity of executing four cycles, the update process may take longer, which is a drawback in terms of time consumption.

PRIOR ART DOCUMENT

Patent Document

Korean Patent Application Publication No. 10-2021-0072391 (Published on Jun. 17, 2021)

SUMMARY

The present disclosure provides a method for efficiently updating a cross point array in two cycles when a resistive processing unit where potentiation and depression are separated is implemented in the form of an array.

In one general aspect of the present disclosure, there is provided a method for updating a cross point array implemented as a device where a potentiation region and a depression region are separated, the method being performed by a control logic and including: in a first cycle, controlling lines where positive values are applied among first lines, in ON state, and applying a first voltage pulse at each of second lines intersecting with the first lines based on an applied value; and in a second cycle, controlling lines where negative values are applied among the first lines, in ON state, and applying a second voltage pulse at each of the second lines based on an applied value.

The controlling of the lines in ON state may include independently applying a voltage pulse based on a positive value or a negative value to each first line controlled in ON state.

The applying of the first voltage pulse may include applying the first voltage pulse at each second line based on a code and magnitude of an applied value.

The applying of the second voltage pulse may include applying the second voltage pulse at each second line based on a code and magnitude opposite to an applied value.

The device may be composed of three transistors and one capacitor.

The device may charge the capacitor through a first transistor, discharge the capacitor through a second transistor, and measure a charge of the capacitor through a third transistor.

The first cycle may be defined independently so as not to overlap with the second cycle.

All devices in the cross point array may be updated in parallel only within the first and second cycles.

In another aspect, there is provided a method for updating a cross point array implemented as a device where a potentiation region and a depression region are converted through a selector, the method being performed by a control logic and including: in a first cycle, controlling lines where positive values are applied among first lines, in ON state, and controlling a connection state of a selector and a first voltage pulse at each of second lines intersecting with the first lines based on an applied value; and in the second cycle, controlling lines where negative values are applied among the first lines, in ON state, and controlling the connection state of the selector and a second voltage pulse at each second line based on an applied value.

The controlling of the lines in ON state may include independently applying a voltage pulse based on a positive value or a negative value to each first line controlled in ON state.

The controlling of the first voltage pulse may include applying the first voltage pulse at each second line based on a code and magnitude of an applied value.

The controlling of the second voltage pulse may include applying the second voltage pulse at each second line based on a code and magnitude opposite to an applied value.

The device may be composed of three NMOS transistors and one capacitor.

The device may include: two transistors connected in series, wherein a voltage source is connected to one end and a capacitor is connected to the other end; a capacitor connected to the other end of the transistors and connected to a ground (GND) at one end; and a read transistor having a gate terminal connected to the capacitor, and measuring a charge of the capacitor.

All devices in the cross point array may be updated in parallel only within the first and second cycles.

In yet another aspect, there is provided a device-based cross point array implemented as a first device where potentiation and depression are separated or as a second device where the potentiation and the depression are converted through a selector, wherein the cross point array comprises a control logic configured to update values applied to all devices in parallel in two independent cycles.

The first device or the second device may be composed of three NMOS transistors and one capacitor.

The second device may include: two transistors connected in series, wherein a voltage source is connected to one end and a capacitor is connected to the other end; a capacitor connected to the other end of the transistors and connected to a ground (GND) at one end; and a read transistor having a gate terminal connected to the capacitor, and measuring a charge of the capacitor.

The control logic may be further configured to, in a first cycle, control lines where positive values are applied among first lines, in ON state, and apply a first voltage pulse at each of second lines intersecting with the first lines based on an applied value.

The control logic may be further configured to, in a second cycle, control lines where negative values are applied among first lines, in ON state, and apply a second voltage pulse at each of second lines based on an applied value.

The disclosed technology may have the following effects. However, since it does not imply that a specific embodiment must include all of the following effects or only the following effects, the scope of the disclosed technology should not be understood to be limited thereto.

In the device-based cross point array and a method for operation thereof according to an embodiment of the present disclosure, it is possible to efficiently perform a cross point array in two cycles when a resistive processing unit where potentiation and depression are separated is implemented in the form of an array.

DESCRIPTION OF EXEMPLARY EMBODIMENTS

Figure 1:
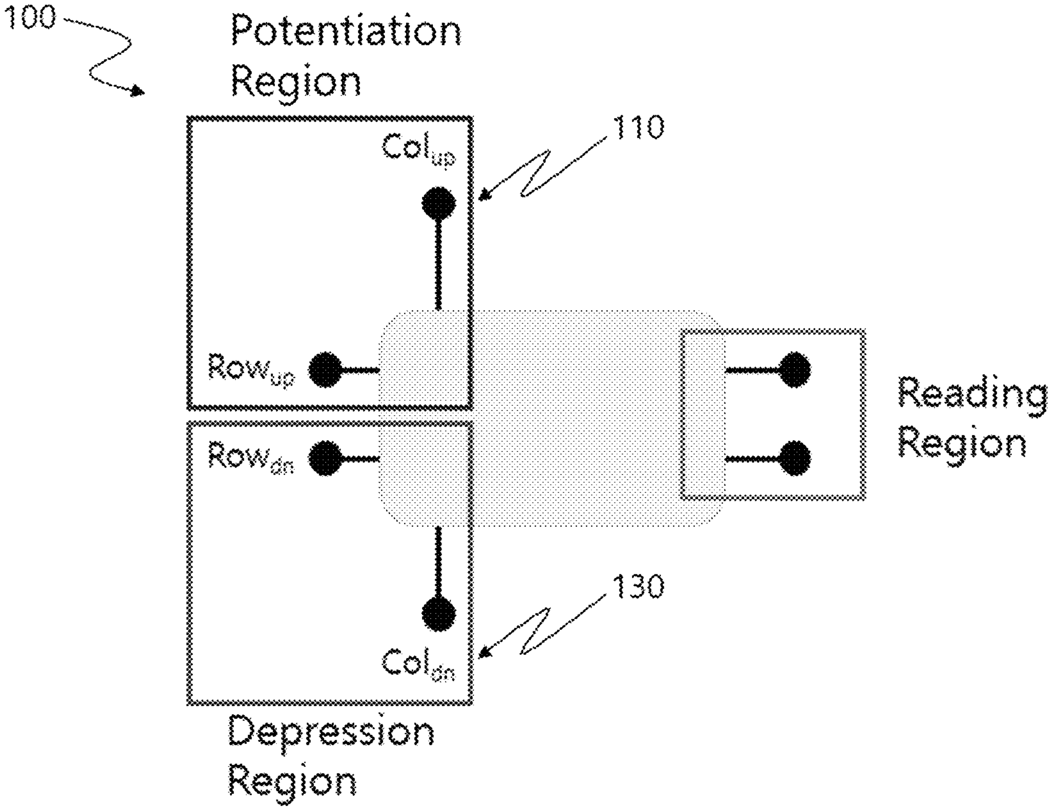
FIG. 1 is a diagram illustrating an embodiment of a device according to the present disclosure.

A description of the present disclosure is merely an embodiment for a structural or functional description and the scope of the present disclosure should not be construed as being limited by an embodiment described in a text. That is, since the embodiment can be variously changed and have various forms, the scope of the present disclosure should be understood to include equivalents capable of realizing the technical spirit. Further, it should be understood that since a specific embodiment should include all objects or effects or include only the effect, the scope of the present disclosure is limited by the object or effect.

Meanwhile, meanings of terms described in the present application should be understood as follows.

The terms "first," "second," and the like are used to differentiate a certain component from other components, but the scope of should not be construed to be limited by the terms. For example, a first component may be referred to as a second component, and similarly, the second component may be referred to as the first component.

It should be understood that, when it is described that a component is "connected to" another component, the component may be directly connected to another component or a third component may be present therebetween. In contrast, it should be understood that, when it is described that an element is "directly connected to" another element, it is understood that no element is present between the element and another element. Meanwhile, other expressions describing the relationship of the components, that is, expressions such as "between" and "directly between" or "adjacent to" and "directly adjacent to" should be similarly interpreted.

It is to be understood that the singular expression encompasses a plurality of expressions unless the context clearly dictates otherwise and it should be understood that term "include" or "have" indicates that a feature, a number, a step, an operation, a component, a part or the combination thereof described in the specification is present, but does not exclude a possibility of presence or addition of one or more other features, numbers, steps, operations, components, parts or combinations thereof, in advance.

In each step, reference numerals (e.g., a, b, c, etc.) are used for convenience of description, the reference numerals are not used to describe the order of the steps and unless otherwise stated, it may occur differently from the order specified. That is, the respective steps may be performed similarly to the specified order, performed substantially simultaneously, and performed in an opposite order.

The present disclosure can be implemented as a computer-readable code on a computer-readable recording medium and the computer-readable recording medium includes all types of recording devices for storing data that can be read by a computer system. Examples of the computer readable recording medium may include a ROM, a RAM, a CD-ROM, a magnetic tape, a floppy disk, an optical data storage device, and the like. Further, the computer readable recording media may be stored and executed as codes which may be distributed in the computer system connected through a network and read by a computer in a distribution method.

If it is not contrarily defined, all terms used herein have the same meanings as those generally understood by those skilled in the art. Terms which are defined in a generally used dictionary should be interpreted to have the same meanings as the meanings in the context of the related art, and are not interpreted as ideal meanings or excessively formal meanings unless clearly defined in the present application.

FIG. 1 is a diagram illustrating an embodiment of a device according to the present disclosure.

Referring to FIG. 1, a first device 100 may correspond to a device implemented in a structure in which a potentiation region 110 and a depression region 130 are separated. The potentiation region 110 may be connected to column lines Colup and row lines Rowup, while the depression region 130 may be connected to column lines Coldn and row lines Rowdn. In other words, due to the structure where the potentiation region 110 and the depression region 130 are separated from each other, the respective states thereof may be controlled through different column lines and row lines.

Figure 2:
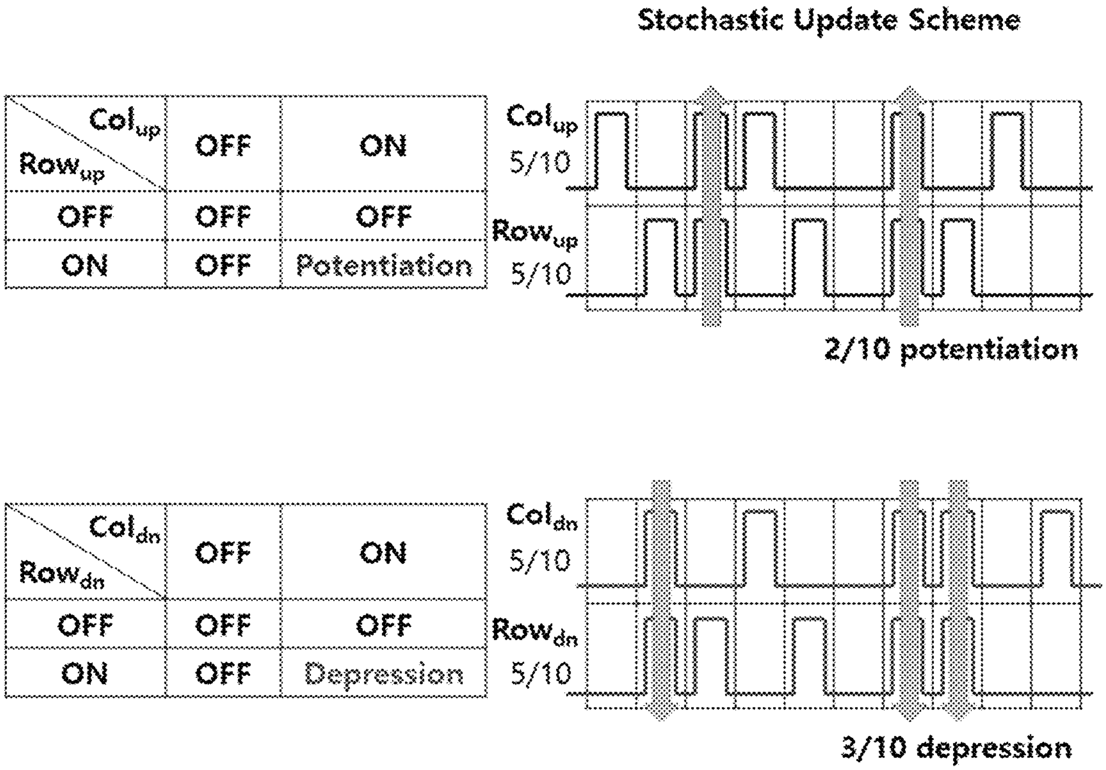
FIG. 2 is a diagram for explaining how the device of FIG. 1 is updated.

FIG. 2 is a diagram for explaining how the device of FIG. 1 is updated.

Referring to FIG. 2, the first device 100 may perform an update process according to a stochastic update scheme. Specifically, in order to potentiate the first element 100, both Rowup and Colup need to be in ON state. Additionally, in order to depress the first element 100, both Rowdn and Coldn need to be in ON state. In other words, the first device 100 may utilize these characteristics to perform both potentiation and depression using the stochastic update scheme.

In addition, the first device 100 may be updated only at a point where a column pulse and a row pulse overlap. In the upper image of FIG. 2, in a process where pulses of column and row occur five times each, two potentiation may occur at two overlapping points of potentiation voltage pulses, resulting in a total of two increases in the value for the update process. In the lower image of FIG. 2, in the process where pulses of column and row occur five times each, three depressions occur at three overlapping points of depression voltage pulses, and thus, update may be performed in a direction of decreasing values. Meanwhile, the voltage pulse may use a random voltage pulse calculated probabilistically.

Figure 3:
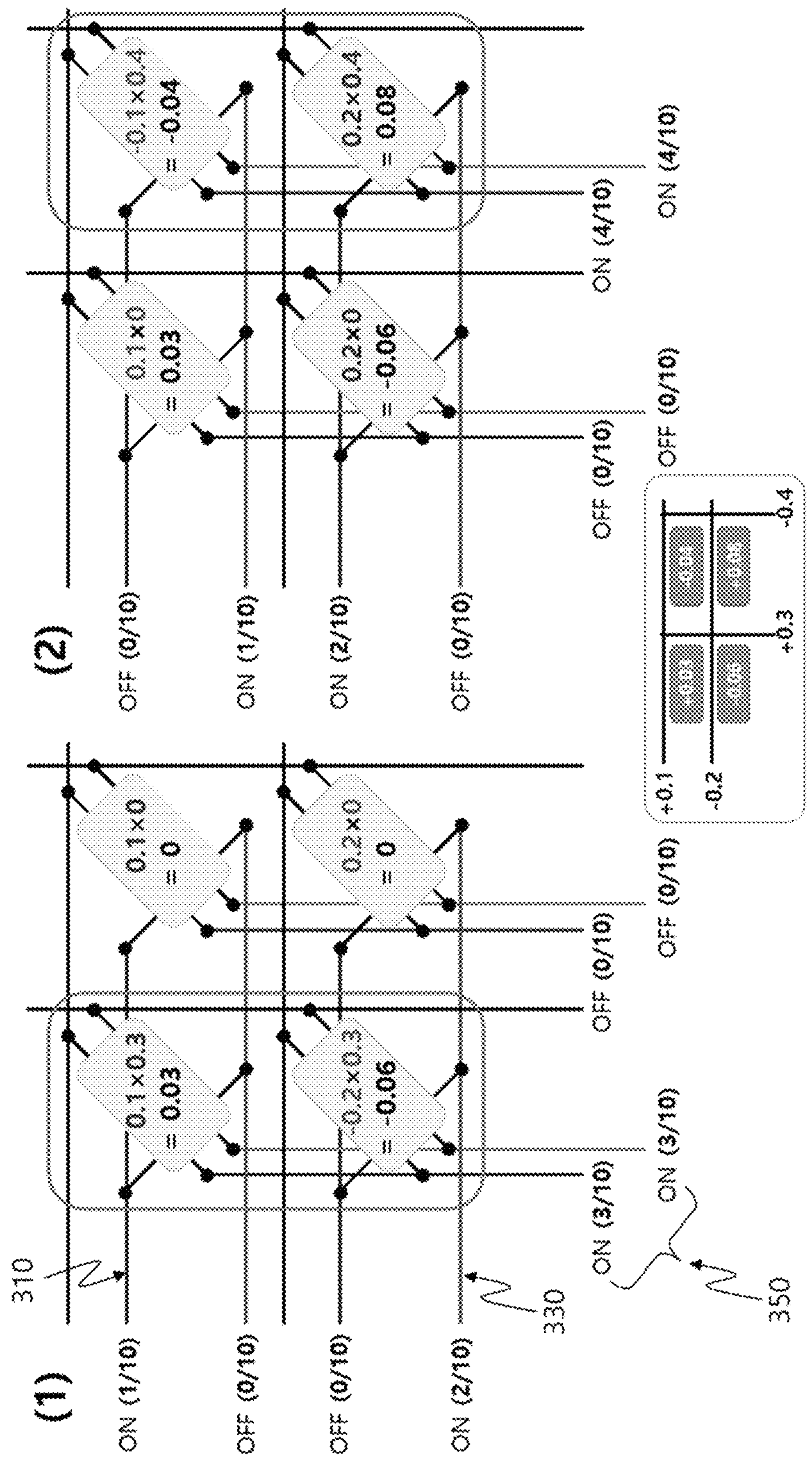
FIG. 3 is a diagram illustrating a method for updating a 2×2 array implemented with the device of FIG. 1 in two cycles.

FIG. 3 is a diagram illustrating a method for updating a 2×2 array implemented with the device of FIG. 1 in two cycles.

Referring to FIG. 3, in a first cycle, since a value corresponding to Co11 350 is 0.3, a pulse of 3/10 is applied. Also, a pulse of 1/10 is applied only at row_up 310 in Row 1, and a pulse of 2/10 is applied only at row_dn 330 in Row 2, enabling updates of 0.03 and −0.06 for device_11 and device_21, respectively. in a second cycle, since a value corresponding to Col2 is −0.4, a pulse of 4/10 is applied to both col_up and col_dn. Also, a pulse of 1/10 is applied only at row_dn in Row1, and a pulse of 2/10 is applied only at row_up in Row2, enabling updates of −0.04 and 0.08 for device_12 and device_22, respectively.

If an array device of a larger size needs to be updated, in the first cycle, all columns having positive values may be controlled to be in ON state and a pulse corresponding to a code and value of each row may be applied to a corresponding row, while, in the second cycle, all columns having negative values may be controlled to be in ON state and a pulse corresponding to a value opposite to a code for each row may be applied to a corresponding row. This process enables updates to be performed within two cycles for arrays of various sizes.

Figure 4:
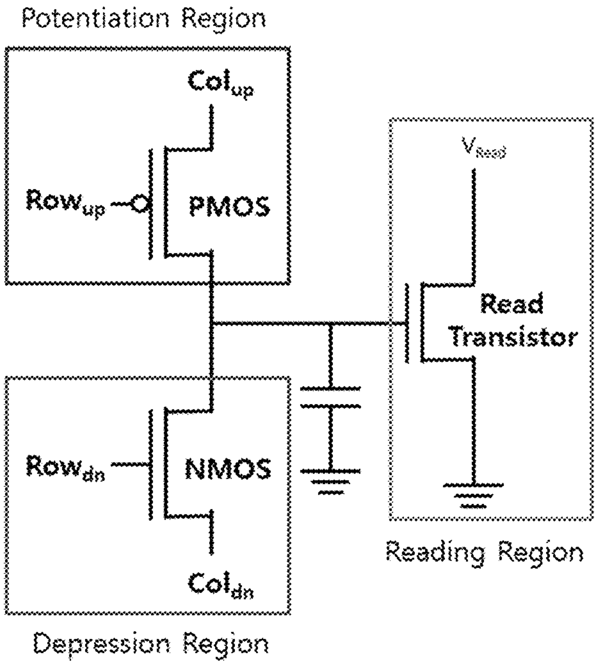
FIG. 4 is a diagram illustrating an embodiment of a resistive processing unit implementing the device of FIG. 1.

FIG. 4 is a diagram illustrating an embodiment of a resistive processing unit implementing the device of FIG. 1.

Referring to FIG. 4, a resistive processing unit that satisfies the device of FIG. 1 may be implemented as a 3-transistor 1-capacitor (3T1C). That is, the resistive processing unit may be implemented with three transistors and one capacitor. In addition, the three transistors may be implemented as a PMOS transistor, an NMOS transistor, and a read transistor.

Specifically, the potentiation region may be composed of the PMOS transistors, while the depression region may be composed of the NMOS transistor. It is possible to write and read data of the device by charging the capacitor through the PMOS transistor, discharging the capacitor through the NMOS transistor, and reading the charge stored in the capacitor through the read transistor.

In addition, only when specific conditions for voltage applied to the gate and drain electrode are met, the PMOS and NMOS transistors may proceed charging and discharging. This may correspond to the same mechanism shown in FIG. 1 where both row_up, col_up and row_dn, col_dn are all in ON state for charging and discharging. If an array is configured using such a resistive processing unit, an update process may be performed in just two cycles, as shown in FIG. 3.

Meanwhile, the PMOS and NMOS transistors may be implemented as oxide semiconductor-based PMOS and NMOS devices, respectively. For example, the oxide semiconductor-based PMOS device may be implemented using copper oxide (Cu2O), tin oxide (SnO), or a combination thereof, while the oxide semiconductor-based NMOS device may be implemented using zinc oxide (ZnO) based materials, such as IGZO (In—Ga—Zn Oxide), GZO (Ga—Zn Oxide), IZTO (Indium-Zn-Tin Oxide), or ZnO in combination.

Figure 5:
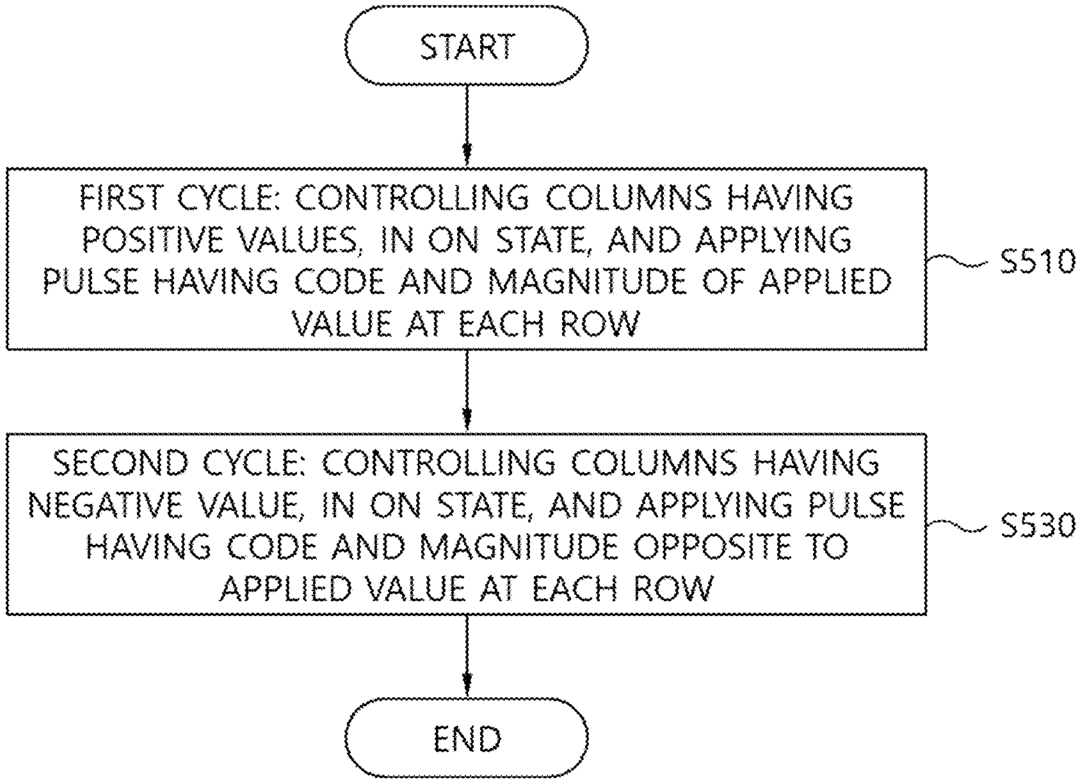
FIG. 5 is a flowchart for explaining an update process of a cross point array implemented with the device of FIG. 1.

FIG. 5 is a flowchart for explaining an update process of a cross point array implemented with the device of FIG. 1.

Referring to FIG. 5, a cross point array according to the present disclosure may be implemented with a device where potentiation and depression are separated. That is, the cross point array may be updated in parallel through two cycles.

First, the values applied to the row lines (or column lines) of the cross point array may be separated into positive and negative, and all devices on row lines corresponding to positive values may be updated in one cycle, while all devices on row lines corresponding to negative values may be updated in the other cycle.

Specifically, in operation S510, an update process may proceed in a manner where in a first cycle, columns having positive values may be controlled to be in ON state and then pulses corresponding to the code and magnitude of the applied values are applied to the respective rows. In operation S530, the update process may proceed in a manner where, in the second cycle, columns having negative values are controlled to be in ON state and then a pulse corresponding to the opposite code and magnitude of an applied value is applied at each row.

Figure 6:
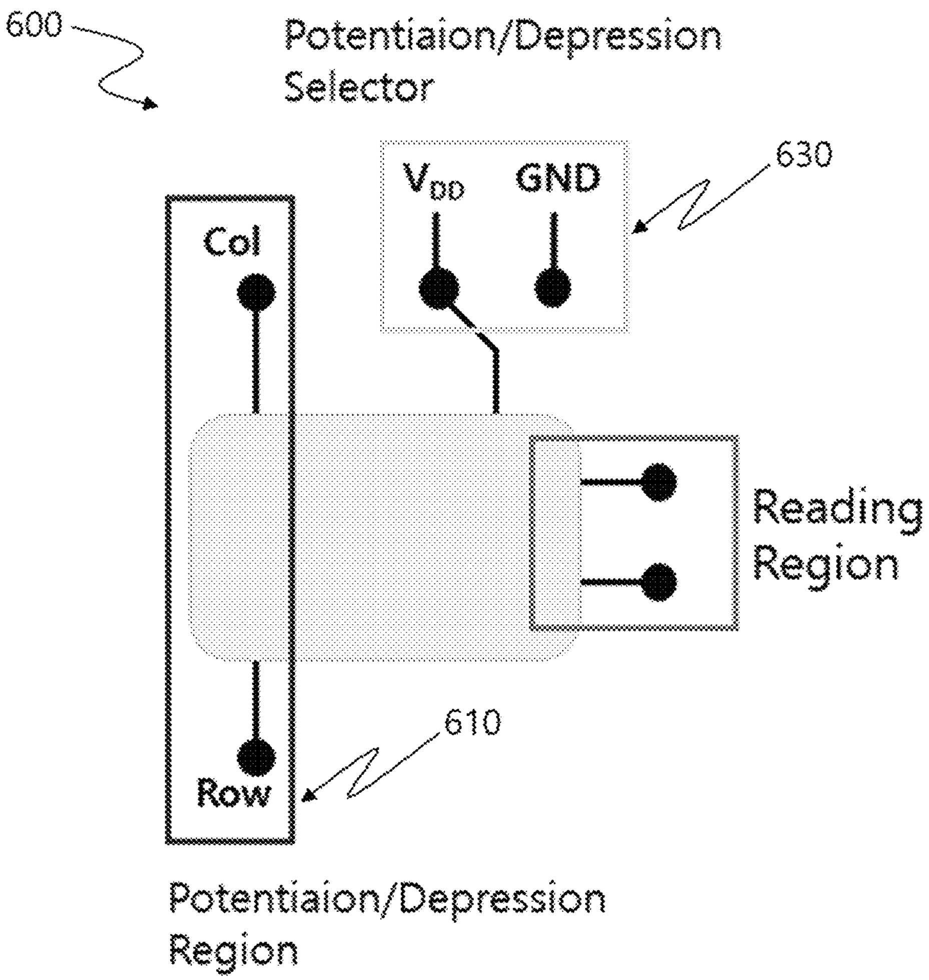
FIG. 6 is a diagram for explaining another embodiment of a device according to the present disclosure.

FIG. 6 is a diagram for explaining another embodiment of a device according to the present disclosure.

Referring to FIG. 6, a second device 600 may correspond to a device implemented in a structure where a potentiation region and a depression region are integrated into one unified region 610 that can be converted by a selector 630. The unified region 610 may be connected to one column line Col and one row line Row, and the selector 630 may be connected to a voltage electrode VDD or a ground electrode GND. Accordingly, while the unified region 610 has been converted to the potentiation region or depression region depending on which electrode is connected to the selector 630, the state of the unified region 610 may be controlled via Col and Row.

Figure 7:
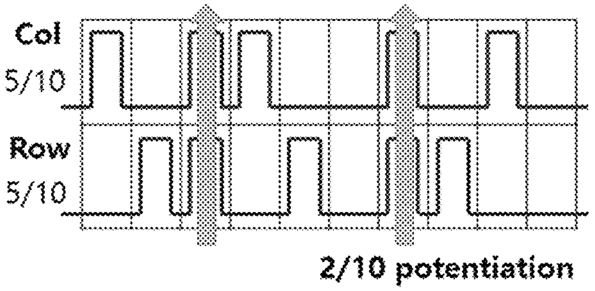
FIG. 7 is a diagram for explaining how the device of FIG. 6 is updated.
Figure 7:
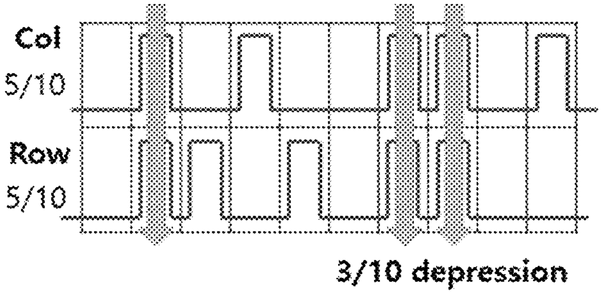

FIG. 7 is a diagram for explaining how the device of FIG. 6 is updated.

Referring to FIG. 7, the second device 600 may perform an update process according to a stochastic update scheme. Specifically, in order to potentiate the second device 600, it is necessary to convert the selector 630 to VDD and then control both Row and Col in ON state. In addition, in order to depress the second device 600, it is necessary to convert the selector 630 to GND and then control both Row and Col in ON state. That is, the second device 600 may utilize these characteristics to perform both potentiation and depression using the stochastic update scheme.

In addition, updates may occur only at points where pulses of column Col and row Row overlap in the second device 600. In the upper image of FIG. 7, the selector 630 is connected to VDD. Also, there are five (5/10) pulses in columns and five (5/10) pulses in rows, and potentiation voltage pulses overlap at two points. This results in a total of two potentiations (2/10), allowing the update to proceed. In the lower image of FIG. 7, there are five pulses in columns and five pulses in rows, and depression voltage pulses overlap at three points. This results in a total of three depressions (3/10), allowing the update to proceed in the direction of decreasing values.

Figure 8:
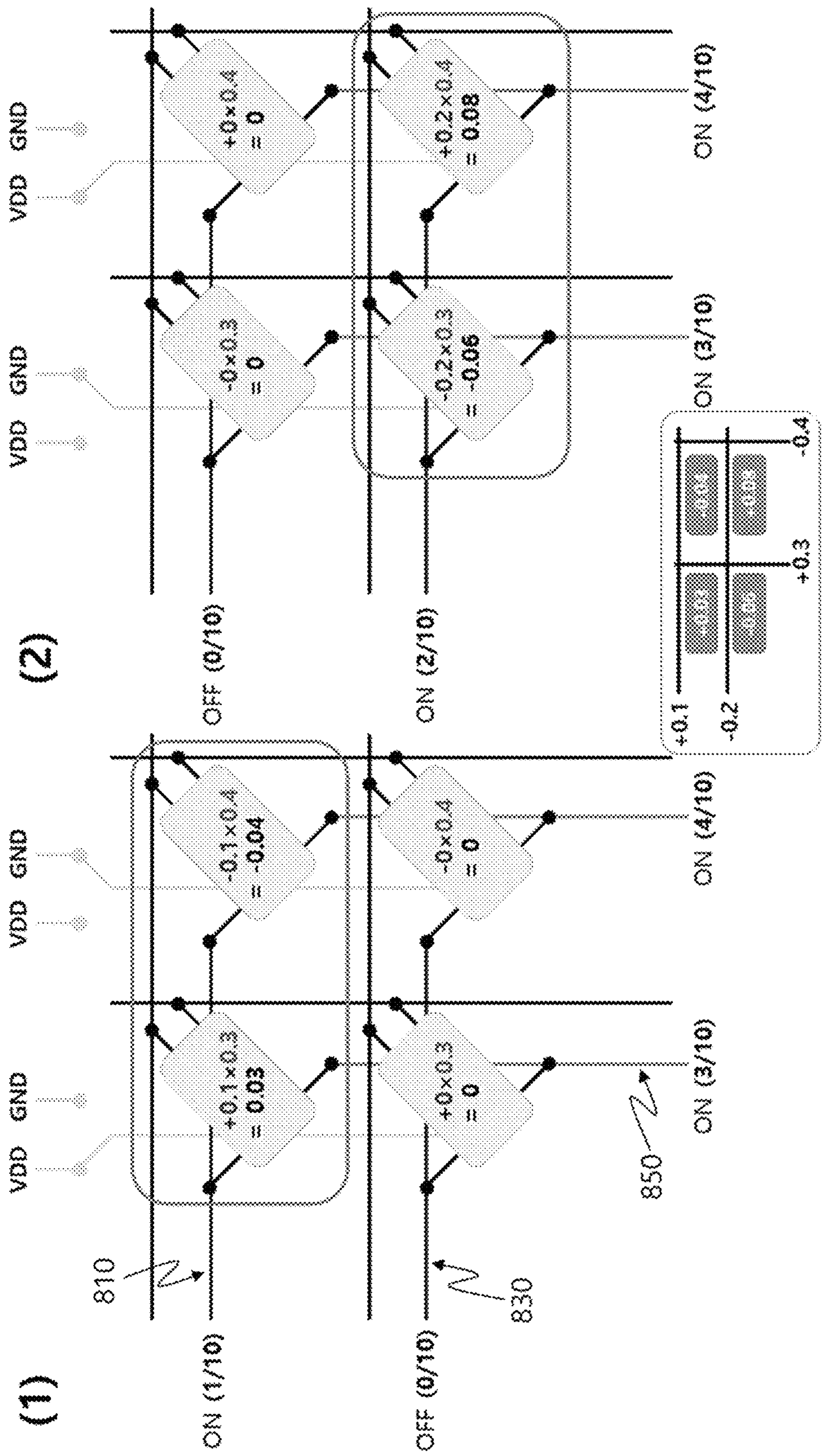
FIG. 8 is a diagram illustrating a method for updating a 2×2 array implemented with the device of FIG. 6 in two cycles.

FIG. 8 is a diagram illustrating a method for updating a 2×2 array implemented with the device of FIG. 6 in two cycles.

Referring to FIG. 8, in the first cycle, since a value corresponding to Row1 810 is 0.1, a pulse of 1/10 may be applied, and since a value corresponding to Col1 850 is 0.3, the selector may be converted to VDD and a pulse of 3/10 may be applied to Col1. In addition, since a value corresponding to Col2 is −0.4, the selector may be converted to GND and a pulse of 4/10 may be applied to Col2. Therefore, in the first cycle, values of 0.03 and −0.04 may be updated in device_11 and device_12, respectively.

In the second cycle, since a value corresponding to Row2 830 is 0.3, a pulse of 2/10 may be applied, and as a value corresponding to Col1 850 is 0.3, the selector may be converted to GND and a pulse of 3/10 may be applied to Col1 850. In addition, since a value corresponding to Col2 is −0.4, the selector may be converted to VDD and a pulse of 4/10 may be applied to Col2. Therefore, in the second cycle, values of −0.06 and 0.08 may be updated in device_21 and device_22, respectively. This process enables updates to be performed within two cycles for arrays of various sizes.

Figure 9:
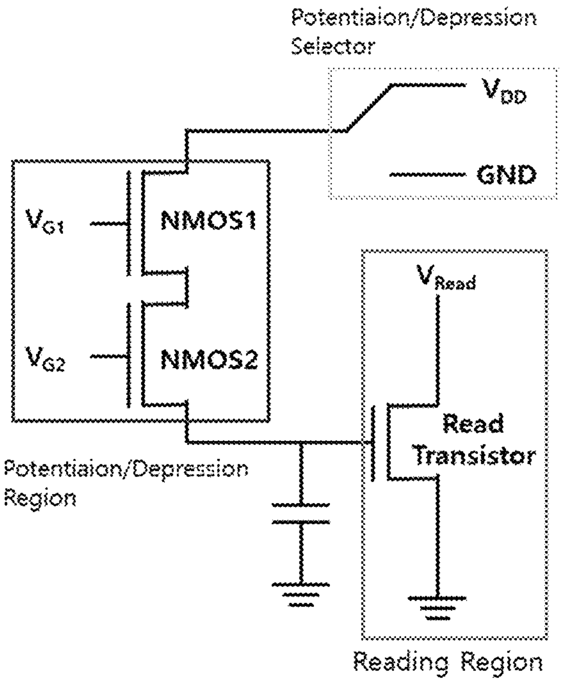
FIG. 9 is a diagram illustrating an embodiment of a resistive processing unit implementing the device of FIG. 6.

FIG. 9 is a diagram illustrating an embodiment of a resistive processing unit implementing the device of FIG. 6.

Referring to FIG. 9, a resistive processing unit that satisfies the device of FIG. 6 may be implemented as a 3-NMOS 1-capacitor (3N1C). That is, the resistive processing unit may be implemented with three NMOS transistors and one capacitor.

Specifically, with two NMOS transistors connected in series, a voltage source VDD, GND may be connected to one end and a capacitor may be connected to the other end. GND may be connected to the other end of the capacitor, which is not connected to the NMOS transistors. In addition, in order to read the charge stored in the capacitor, an end of the capacitor may be connected to a gate electrode of a read NMOS transistor.

Accordingly, for charging, the both NMOS transistors may be controlled in ON state (i.e., $VG1=VG2>Vth$), and the voltage source may be set to VDD. For discharging, the both NMOS transistors may be controlled in ON state, and the voltage source may be set to GND. Furthermore, to halt charging, at least one of the two NMOS transistors may be controlled to OFF state (i.e., $VG1<Vth$ or $VG2<Vth$). To read the charge stored in the capacitor, the both NMOS transistors may be controlled to OFF state (i.e., $VG1=VG2<Vth$), and current may be measured through the read NMOS transistor.

Additionally, charging and discharging may be implemented only when the voltage applied to the gate electrodes of the two NMOS transistors meets specific conditions. This may be the same mechanism shown in FIG. 6 where both rows and columns must be in ON state for charging and discharging. When an array is configured using such a resistive processing unit, the update process may be performed in just two cycles, as shown in FIG. 8.

Figure 10:
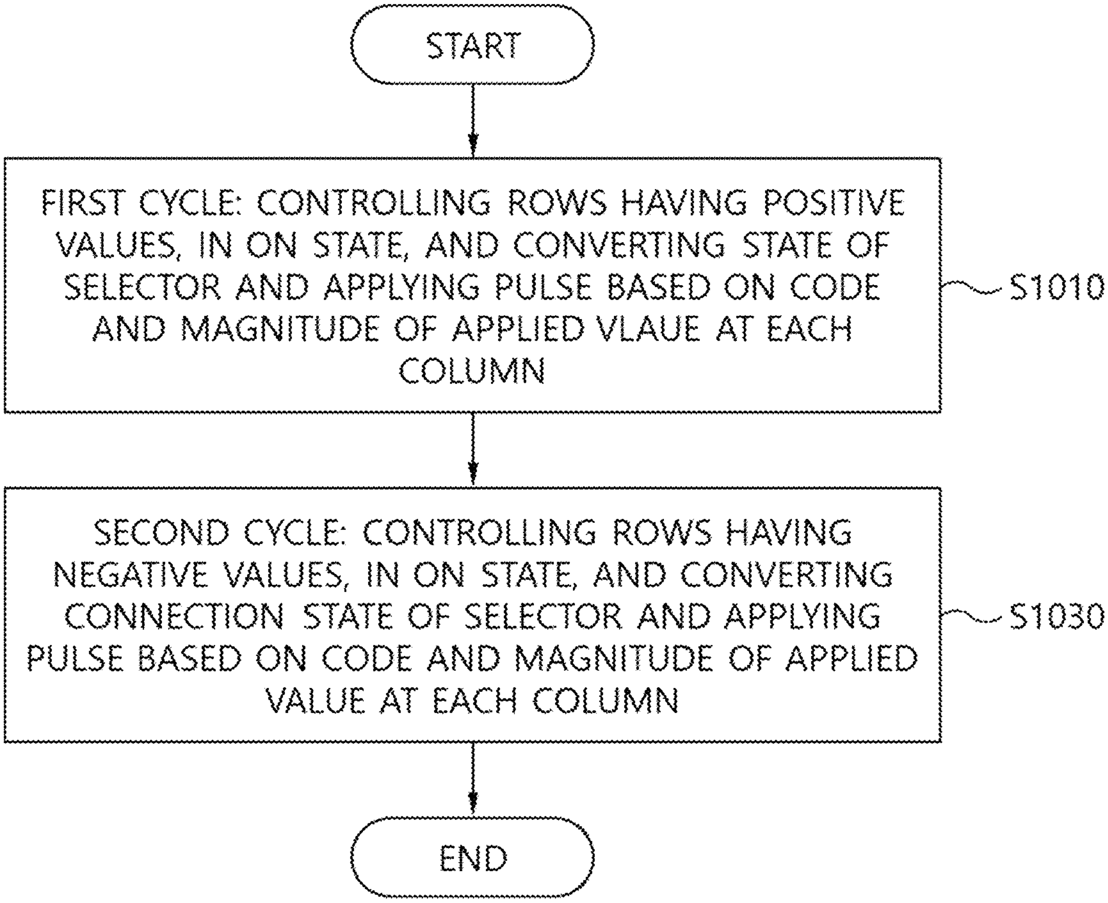
FIG. 10 is a flowchart for explaining an update process of a cross point array implemented with the device of FIG. 6.

FIG. 10 is a flowchart for explaining an update process of a cross point array implemented with the device of FIG. 6.

Referring to FIG. 10, a cross point array according to the present disclosure may be implemented as a device in a structure where a potentiation region and a depression region are integrated into a unified region 610 that can be converted by the selector 630. That is, the cross point array may be updated in parallel through two cycles.

Specifically, in operation S1010, an update process may proceed in a manner where, in the first cycle, rows having positive values are controlled in ON state and then converting the state of the selector and applying a pulse is performed at each column based on a code and magnitude of an applied value. In operation S1030, in the second cycle, the update process may proceed in a manner where, in the second cycle, rows having negative values are controlled in ON state, and then converting the state of the selector and applying a pulse may be performed at each column based on a code and magnitude of an applied value.

Figure 11:
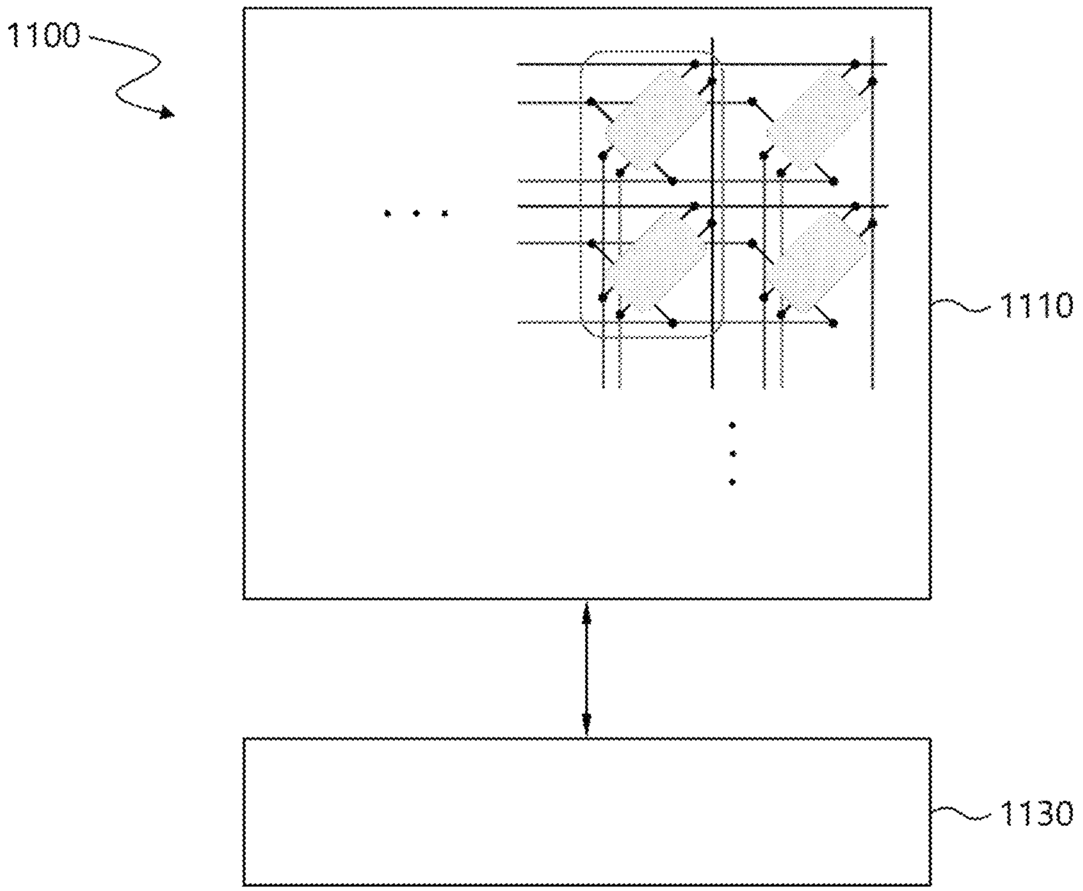
FIG. 11 is a diagram for explaining an embodiment of a cross point array according to the present disclosure.

FIG. 11 is a diagram for explaining an embodiment of a cross point array according to the present disclosure.

Referring to FIG. 11, a cross point array 1100 may include a memory cell array 1110 and a control logic 1130. The memory cell array 1110 may be composed of memory cells for storing data, and each memory cell may store data of 1 bit or multiple bits. In addition, each memory cell may be placed at a cross point where a first line arranged in a first direction intersects with a second line arranged to intersect with the first direction. For example, the first line may correspond to a word line, and the second line may correspond to a bit line. For each memory cell, a specific word line may be selected from among the first lines based on a row address, and a specific bit line may be selected from among the second lines based on a column address. In one embodiment, each memory cell may be implemented as a first device where potentiation and depression are separated, or as a second device where potentiation and depression are converted through a selector.

The control logic 1130 may control read, write, and other operations on the memory cell array 1110. In addition, the control logic 1130 may provide address decoding and timing signals, which are necessary for reading from and writing to the memory cell array 1110. In particular, the control logic 1130 may control the operation of updating values applied to all devices of the memory cell array 1110 in parallel within two independent cycles.

Specifically, in a method for updating a cross point array implemented as the first device, the control logic 1130 may, in a first cycle, control lines where positive values are applied among first lines (i.e., column lines), in ON state, and apply a first voltage pulse at each of the second lines (i.e., low lines) intersecting with the first lines based on a code and magnitude corresponding to an applied value, and in a second cycle defined independently of the first cycle, may control lines where negative values are applied among the first lines, in ON state, and apply a second voltage pulse at each of the second lines based on a code and magnitude opposite to an applied value.

In addition, in a method for updating a cross point array implemented as a second device, the control logic 1130 may, in a first cycle, control lines where positive values are applied among the first lines (i.e., low lines), in ON state, and control a connection state of the selector and a first voltage pulse based on an applied value at each of the second lines (i.e., column lines) intersecting with the first lines, and, in a second cycle defined independently of the first cycle, may control lines where negative values are applied among the first lines, in ON state, and control a connection state of the selector and a second voltage pulse at each of the second lines based on an applied value.

In one embodiment, the cross point array 1100 may be implemented as a memory device in conjunction with a memory controller. In this case, the control logic 1130 of the cross point array 1100 may operate in conjunction with the memory controller. For example, the control logic 1130 may receive a command CMD, an address ADDR, and a control signal CTRL from the memory controller, and may output a control signal to access the memory cell array 1110 to write or read data.

Figure 12:
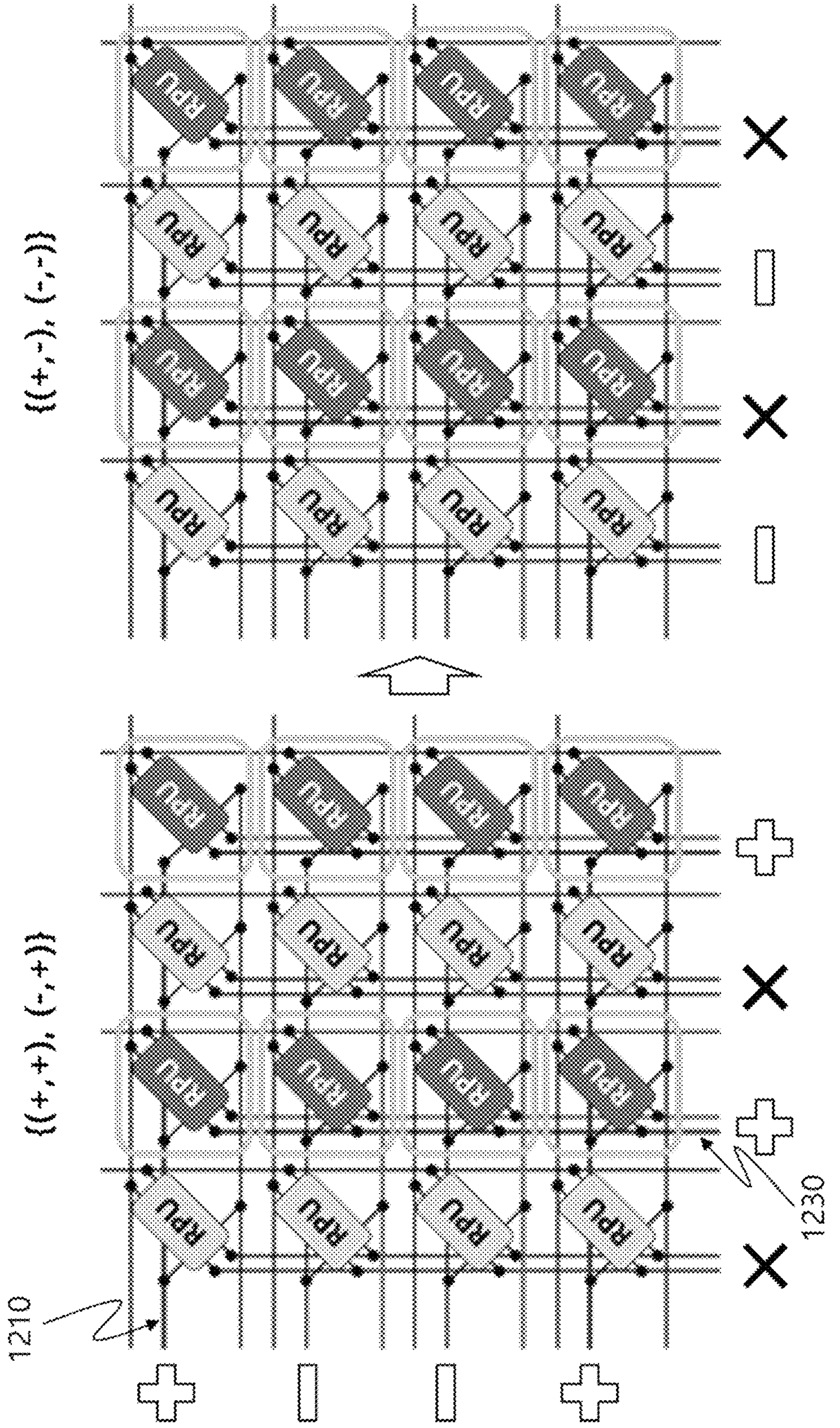
FIG. 12 is a diagram illustrating an embodiment of a two-cycle update process according to the present disclosure.

FIG. 12 is a diagram illustrating an embodiment of a two-cycle update process according to the present disclosure.

Referring to FIG. 12, a method for updating a device-based cross point array where potentiation and depression are separated according to the present disclosure may enable updating the entire cross point array with only two cycles.

First, in the first cycle of the update method, a voltage pulse may be applied to both the potentiation region and the depression region for column lines 1230 having positive values. In addition, for each row line 1210, a voltage pulse may be applied to the potentiation region for the positive value line (+) and to the depression region for the negative value line (−). For example, in the first cycle, a voltage pulse having the code and magnitude corresponding to a value applied to each row may be applied.

Next, in the second cycle of the update method, a voltage pulse may be applied to both the potentiation region and the depression region for column lines 1230 having negative values. In addition, for each row line 1210, a voltage pulse may be applied to the depression region for the positive value line (+) and to the potentiation region for the negative value line (−). For example, in the second cycle, a voltage pulse having a code and magnitude opposite to the value applied to each row line may be applied.

Figure 13:
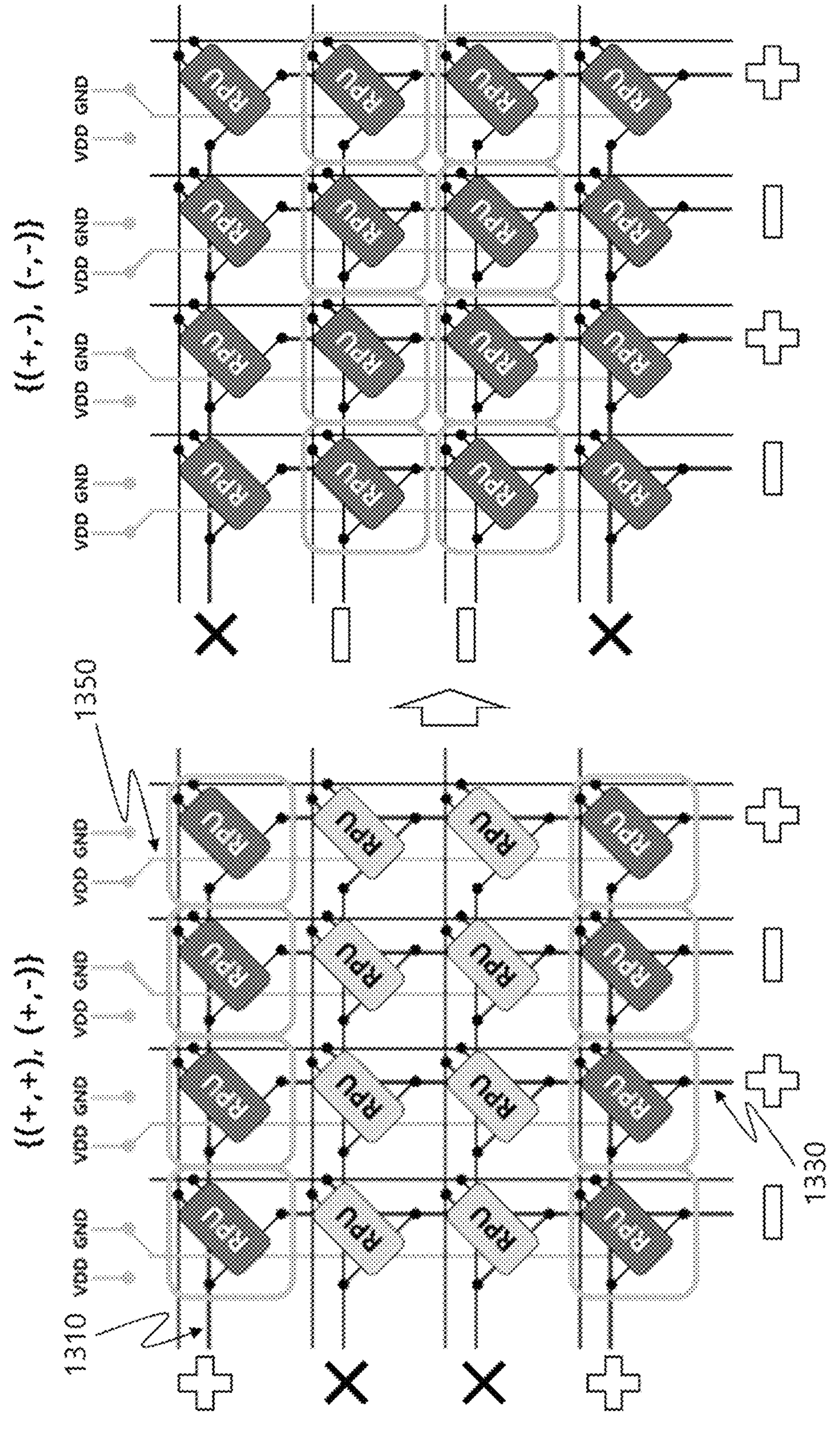
FIG. 13 is a diagram for explaining another embodiment of a two-cycle update process according to the present disclosure.

FIG. 13 is a diagram for explaining another embodiment of a two-cycle update process according to the present disclosure.

Referring back to FIG. 13, a method for updating a device-based cross point array where potentiation and depression are converted through a selector according to the present disclosure may enable updating the entire cross point array with only two cycles.

First, in a first cycle of the update method, voltage pulses may be applied only to row lines 1310 having positive values. At this point, for column line 1330, voltage pulses may be applied to both lines having positive values (+) and lines having negative values (−), and through selector lines 1350, VDD may be selected for column lines 1330 having the positive values while GND may be selected for column lines 1330 having negative values.

Next, in a second cycle of the update method, voltage pulses may be applied only to row lines 1310 having negative values. At this point, for the column line 1330, voltage pulses may be applied to both lines having positive values (+) and lines having negative values (−), and through the selector lines 1350, GND may be selected for the column line 1330 having positive values while VDD may be selected for the column lines 1330 having negative values.

A device-based cross point array according to the present disclosure may be implemented with a resistive processing unit where potentiation and depression are separated, and a method for updating the cross point array in parallel with only two cycles rather than four cycles may be provided.

Specifically, in the update method according to the present disclosure, every device may be updated in a manner in which values corresponding to rows (or columns) of the array are divided into positive and negative, all devices corresponding to rows (columns) having positive values are updated in the first cycle, and then all devices corresponding to rows (columns) having negative values are updated in the second cycle. In doing this, the update method according to the present disclosure may perform the update process twice as fast as the existing method.

While the present disclosure has been particularly shown and described with reference to exemplary embodiments thereof, it will be understood by those of ordinary skill in the art that various modifications and changes may be made therein through inclusion, alteration, removal or addition of elements without departing from the spirit and scope of the present disclosure as defined by the following claims.

[Detailed Description of Main Elements]

| | |
|---|---|
| 100: first device | |
| 110: potentiation region | 130: depression region |
| 310: row_up | 330: row_dn |
| 350: Col1 | |
| 600: second device | |
| 610: unified region | 630: selector |
| 810: Row1 | 830: Row2 |
| 850: Col1 | |
| 1100: cross point array | |
| 1110: memory cell array | 1130: control logic |
| 1210, 1310: row line | 1230, 1330: column line |
| 1350: selector line | |

What is claimed is:

1. A method for updating a cross point array implemented as a first device where a potentiation region and a depression region are separated, the method being performed by a control logic and comprising;

in a first cycle, controlling lines where positive values are applied among first lines in ON state, and applying a first voltage pulse at each of second lines intersecting with the first lines based on an applied value to the each of second lines; and in a second cycle, controlling lines where negative values are applied among the first lines in ON state, and applying a second voltage pulse at each of the second lines based on the applied value to the each of second lines, wherein the first voltage pulse and the second voltage pulse are random voltage pulses, which are calculated probabilistically.

2. The method of claim 1, wherein the controlling of the lines in ON state comprises independently applying a voltage pulse based on a positive value or a negative value to each first line controlled in ON state.

3. The method of claim 1, wherein the applying of the first voltage pulse comprises applying the first voltage pulse at each second line based on a code and magnitude of the applied value to the each of second lines.

4. The method of claim 2, wherein the applying of the second voltage pulse comprises applying the second voltage pulse at each second line based on an opposite code and magnitude of the applied value to the each of second lines.

5. The method of claim 1, wherein the device is composed of three transistors and one capacitor.

6. The method of claim 5, wherein the device charges the capacitor through a first transistor, discharges the capacitor through a second transistor, and measures a charge of the capacitor through a third transistor.

7. The method of claim 1, wherein the first cycle is defined independently so as not to overlap with the second cycle.

8. The method of claim 1, wherein all devices in the cross point array are updated in parallel only within the first and second cycles.

9. A method for updating a cross point array implemented as a second device where a potentiation region and a depression region are converted through a selector, the method being performed by a control logic and comprising:

in a first cycle, controlling lines where positive values are applied among first lines in ON state, and controlling a connection state of a selector and a first voltage pulse at each of second lines intersecting with the first lines based on an applied value; value to the each of second lines; and in the second cycle, controlling lines where negative values are applied among the first lines in ON state, and controlling the connection state of the selector and a second voltage pulse at each second line based on the applied value to the each of second lines, wherein the first voltage pulse and the second voltage pulse are random voltage pulses, which are calculated probabilistically.

10. The method of claim 9, wherein the controlling of the lines in ON state comprises independently applying a voltage pulse based on a positive value or a negative value at each first line controlled in ON state.

11. The method of claim 9, wherein the controlling of the first voltage pulse comprises applying the first voltage pulse at each second line based on a code and magnitude of the applied value to the each of second lines.

12. The method of claim 11, wherein the controlling of the second voltage pulse comprises applying the second voltage pulse at each second line based on an opposite code and magnitude of the applied value to the each of second lines.

13. The method of claim 9, wherein the device is composed of three NMOS transistors and one capacitor.

14. The method of claim 10, wherein the device comprises:

two transistors connected in series, wherein a voltage source is connected to one end and a capacitor is connected to the other end;

a capacitor connected to the other end of the transistors and connected to a ground (GND) at one end; and a read transistor having a gate terminal connected to the capacitor, and measuring a charge of the capacitor.

15. The method of claim 9, wherein all devices in the cross point array are updated in parallel only within the first and second cycles.

16. A device-based cross point array implemented as a first device where a potentiation region and a depression region are separated are separated or as a second device where the potentiation region and the depression region are converted through a selector, the cross point array comprising:

a control logic configured to update values applied to all devices in parallel in two independent cycles, wherein the control logic is configured to update the values based on random voltage pulses, which are calculated probabilistically.

17. The cross point array of claim 16, wherein the first device or the second device is composed of three NMOS transistors and one capacitor.

18. The cross point array of claim 17, wherein the second device comprises:

two transistors connected in series, wherein a voltage source is connected to one end and a capacitor is connected to the other end;

a capacitor connected to the other end of the transistors and connected to a ground (GND) at one end; and a read transistor having a gate terminal connected to the capacitor, and measuring a charge of the capacitor.

19. The cross point array of claim 16, wherein the control logic is further configured to, in a first cycle, control lines where positive values are applied among first lines in ON state, and apply a first voltage pulse at each of second lines intersecting with the first lines based on an applied value to the each of second lines, wherein the first voltage pulse is the random voltage pulse.

20. The method of claim 17, wherein the control logic is further configured to, in a second cycle, control lines where negative values are applied among first lines in ON state, and apply a second voltage pulse at each of second lines based on an applied value to the each of second lines, wherein the second voltage pulse is the random voltage pulse.

* * * * *